(12) United States Patent
Dong et al.

(10) Patent No.: US 10,978,667 B2
(45) Date of Patent: Apr. 13, 2021

(54) SUBSTRATE TO BE ENCAPSULATED, ENCAPSULATION ASSEMBLY AND DISPLAY DEVICE HAVING THE SAME

(71) Applicants: BOE TECHNOLOGY GROUP CO., LTD., Beijing (CN); Chengdu BOE Optoelectronics Technology Co., Ltd., Sichuan (CN)

(72) Inventors: Wanli Dong, Beijing (CN); Jibum Yang, Beijing (CN)

(73) Assignees: BOE TECHNOLOGY GROUP CO., LTD., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 61 days.

(21) Appl. No.: 15/769,489

(22) PCT Filed: Nov. 15, 2017

(86) PCT No.: PCT/CN2017/111036
§ 371 (c)(1),
(2) Date: Apr. 19, 2018

(87) PCT Pub. No.: WO2018/157622
PCT Pub. Date: Sep. 7, 2018

(65) Prior Publication Data
US 2019/0123296 A1    Apr. 25, 2019

(30) Foreign Application Priority Data
Mar. 1, 2017    (CN) .................. 201710116833.8

(51) Int. Cl.
*H01L 51/00*    (2006.01)
*H01L 51/52*    (2006.01)
*H01L 27/32*    (2006.01)

(52) U.S. Cl.
CPC ...... *H01L 51/5246* (2013.01); *H01L 27/3244* (2013.01); *H01L 51/0096* (2013.01)

(58) Field of Classification Search
CPC ............. H01L 51/5246; H01L 27/3244; H01L 27/3241; H01L 51/0096
See application file for complete search history.

(56) References Cited

U.S. PATENT DOCUMENTS

| | | | |
|---|---|---|---|
| 6,704,072 B2 * | 3/2004 | Jeong .................... | G02F 1/1339 345/82 |
| 6,724,150 B2 * | 4/2004 | Maruyama ........... | G09G 3/3233 315/169.3 |

(Continued)

FOREIGN PATENT DOCUMENTS

| | | |
|---|---|---|
| CN | 1658713 A | 8/2005 |
| CN | 103280540 A | 9/2013 |

(Continued)

OTHER PUBLICATIONS

International Search Report & Written Opinion dated Feb. 7, 2018, regarding PCT/CN2017/111036.

(Continued)

*Primary Examiner* — Mounir S Amer
*Assistant Examiner* — Alexander Belousov
(74) *Attorney, Agent, or Firm* — Intellectual Valley Law, P.C.

(57) ABSTRACT

A substrate to be encapsulated, an encapsulation assembly and a display device are provided. The substrate to be encapsulated comprises a base substrate, and a plurality of notches arranged in an array located in a region to be attached to an encapsulation layer, wherein the plurality of notches have a same shape of regular polygon.

16 Claims, 5 Drawing Sheets

(56) References Cited

U.S. PATENT DOCUMENTS

| | | | |
|---|---|---|---|
| 7,486,368 B2* | 2/2009 | Sakakura | H01L 51/5237 349/153 |
| 7,535,538 B2* | 5/2009 | Yamada | G02F 1/1339 349/110 |
| 7,728,948 B2* | 6/2010 | Nishi | G02F 1/1339 349/153 |
| 7,795,803 B2* | 9/2010 | Kim | H01L 51/5246 313/504 |
| 7,952,678 B2* | 5/2011 | Chan | G02F 1/1339 349/153 |
| 9,425,429 B2* | 8/2016 | Kamiya | H01L 27/3246 |
| 9,660,217 B2* | 5/2017 | Fukuda | H01L 51/5246 |
| 9,755,189 B2* | 9/2017 | Nishido | C23F 1/02 |
| 9,891,475 B2* | 2/2018 | Lee | G02F 1/1339 |
| 10,033,010 B2* | 7/2018 | Ao | H01L 27/3262 |
| 2002/0149320 A1* | 10/2002 | Maruyama | G09G 3/3233 315/169.3 |
| 2005/0184652 A1* | 8/2005 | Maruyama | G09G 3/3233 313/504 |
| 2005/0184927 A1* | 8/2005 | Kwak | H01L 27/3276 345/45 |
| 2007/0076433 A1 | 4/2007 | Kinoshita et al. | |
| 2007/0170854 A1* | 7/2007 | Kwak | H01L 51/5246 313/512 |
| 2007/0176548 A1* | 8/2007 | Kim | H01L 51/524 313/512 |
| 2008/0129946 A1* | 6/2008 | Chan | G02F 1/1339 349/153 |
| 2012/0002145 A1* | 1/2012 | Lee | G02F 1/136204 349/106 |
| 2013/0075926 A1 | 3/2013 | Bae et al. | |
| 2014/0065916 A1 | 3/2014 | Lee et al. | |
| 2015/0162562 A1* | 6/2015 | Maruyama | G09G 3/3233 257/40 |
| 2016/0293883 A1 | 10/2016 | Hong et al. | |
| 2017/0288165 A1* | 10/2017 | Ao | H01L 27/3262 |

FOREIGN PATENT DOCUMENTS

| | | |
|---|---|---|
| CN | 103681484 A | 3/2014 |
| CN | 205281089 U | 6/2016 |
| CN | 106410062 A | 2/2017 |
| KR | 100671638 B1 | 1/2007 |

OTHER PUBLICATIONS

First Office Action in the Chinese Patent Application No. 201710116833.8, dated Apr. 14, 2020; English translation attached.

First Office Action in the Indian Patent Application No. 201827019385, dated Jun. 30, 2020.

Extended European Search Report in the European Patent Application No. 17859371.1, dated Dec. 14, 2020.

* cited by examiner

SUBSTRATE TO BE ENCAPSULATED, ENCAPSULATION ASSEMBLY AND DISPLAY DEVICE HAVING THE SAME

CROSS-REFERENCE TO RELATED APPLICATION

This application is a national stage application under 35 U.S.C. § 371 of International Application No. PCT/CN2017/111036, filed Nov. 15, 2017, which is based upon and claims priority to Chinese Patent Application Serial No. 201710116833.8, filed with the State Intellectual Property Office of P. R. China on Mar. 1, 2017, the entire contents of which are incorporated herein by reference.

TECHNICAL FIELD

The present disclosure relates to a display technology field, and more particularly, to a substrate to be encapsulated, an encapsulation assembly and a display device having the same.

BACKGROUND

In the art of encapsulation assemblies, such as an active matrix organic light emitting diode (AMOLED) display device and an organic light emitting diode (OLED) display device, an encapsulation layer and a substrate are normally attached by an encapsulation process. Generally, the encapsulation process plays an important role in service life of the encapsulation assembly since the encapsulation process may prevent water or oxygen from permeating into the encapsulation assembly. In the encapsulation process, frit or resin may be used as an adhesive during an attaching step. Specifically, there is a plurality of holes, which are normally in a quadrangular shape, in the substrate. These holes may improve the contact surface area between the substrate and an adhesive layer, thus improving the adhesive force and encapsulation performances and decreasing mechanical properties and permeability to water or oxygen. There is still a requirement for a further development of the encapsulation performance of the encapsulation assembly.

SUMMARY

In the present disclosure, a substrate to be encapsulated, an encapsulation assembly and a display device are provided.

In a first aspect of embodiments of the present disclosure, a substrate to be encapsulated is provided, comprising:

a base substrate; and a plurality of notches arranged in an array located in a region to be attached to an encapsulation layer, wherein the plurality of notches have a same shape of regular polygon.

In some embodiments of the present disclosure, the array comprises a plurality of first rows and a plurality of second rows arranged alternately, and the plurality of notches of in the plurality of first rows and the plurality of second rows have a displacement along a row direction.

In some embodiments of the present disclosure, at least two adjacent notches in a same row have a gap with a first length along the row direction, the displacement has a second length along the row direction, and the first length is equal or smaller than the second length.

In some embodiments of the present disclosure, the plurality of notches are arranged along a same direction, one of diagonals of the regular polygon is parallel with the row direction.

In some embodiments of the present disclosure, the plurality of notches are arranged along a same direction, one of diagonals of the regular polygon is perpendicular to the row direction.

In some embodiments of the present disclosure, the substrate to be encapsulated above further comprises a structural layer, wherein the plurality of notches are located in the structural layer.

In some embodiments of the present disclosure, the plurality of notches are located in the base substrate.

In a second aspect of embodiments of the present disclosure, an encapsulation assembly is provided, including: a base substrate, an encapsulation layer that packages the base substrate in a encapsulation region, an adhesive layer between the base substrate and the encapsulation layer in the encapsulation region for attaching, and a plurality of notches arranged in an array are located in the encapsulation region, wherein the plurality of notches have a same shape of regular polygon.

In some embodiments of the present disclosure, the encapsulation assembly is an active matrix organic light emitting diode (AMOLED) display panel.

In a third aspect of embodiments of the present disclosure, a display device is provided, including the encapsulation assembly as described in the second aspect.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples of the present disclosure. Also, common but well-understood elements that are useful or necessary in a commercially feasible example are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

Reference will now be made in detail to clearly and completely describe exemplary embodiments, examples of the present disclosure which are illustrated in the accompanying drawings, thus showing the objects and advantages of the embodiments of the present disclosure. Specifically, embodiments described herein are only a part of all the possible embodiments of the present disclosure. One skilled in the art may achieve other embodiments based on the description of the embodiments of the present disclosure, and these embodiments are still in the scope of the present disclosure.

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information, and similarly, second information may also be termed as first information. As used herein, the term "if" may be understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an example is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may be combined in any suitable manner.

The technical solutions provided in embodiments of the present disclosure may have following advantageous effects.

With the substrate according to embodiments of the present disclosure, the extending part may be formed at any notch and there is a recessed part of the region of the first surface between extending parts of two adjacent notches in the same row. In such a manner, the extending parts of at least some of the notches (i.e., a plurality of the first notches) in the first row are facing to the recessed parts described above. In such a case, compared to quadrangular notches commonly used, at least some of the notches in the first row may be interlaced with the notches in the second row and thus the number of notches arranged in a same area can be increased. Therefore, the contact surface area between the substrate and an adhesive layer in the encapsulation process may be improved, as well as the encapsulation performances FIG. 1 is a schematic view illustrating a distribution of notches arranged in a corner of a region of a substrate to be attached to an encapsulation layer in other implementations, and FIG. 2 is a schematic view illustrating a distribution of notches arranged in a corner of a region of a substrate to be attached to an encapsulation layer according to some embodiments of the present disclosure.

Figure 1:
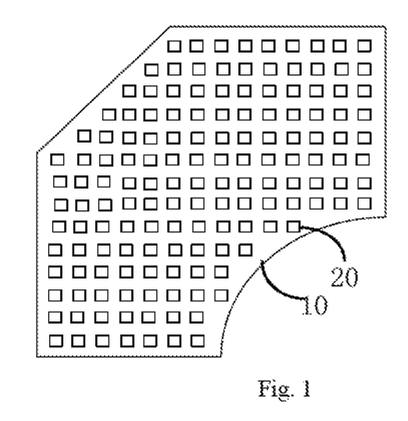
FIG. 1 is a schematic view illustrating a distribution of notches arranged in a corner of a region of a substrate to be attached to an encapsulation layer in other implementations.
Figure 2:
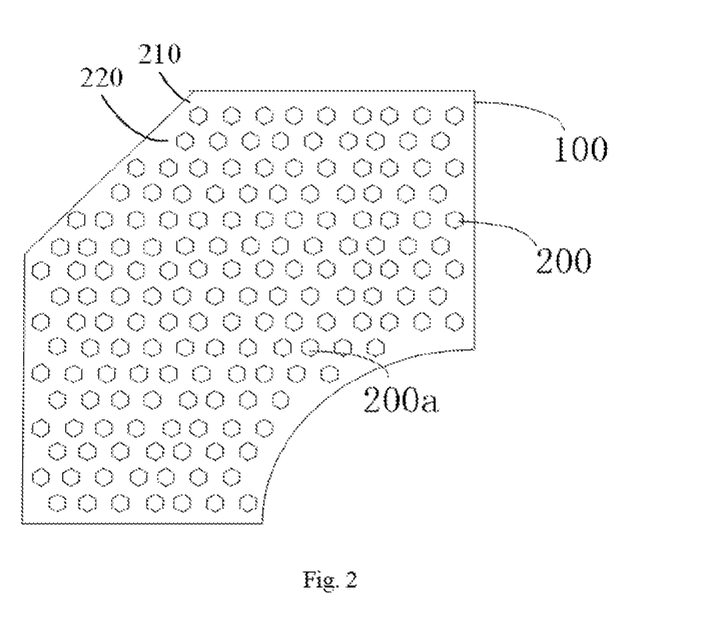
FIG. 2 is a schematic view illustrating a distribution of notches arranged in a corner of a region of a substrate to be attached to an encapsulation layer according to some embodiments of the present disclosure.

As shown in FIG. 1, notches in a substrate normally have a quadrangular shape. A normal quadrangular notch 20 has an area of, for example, about 900 $\mu m^2$, and the number of the notches 20 arranged in the curved region 10 of a corner of the substrate is 147. As shown in FIG. 2, the notch 200 formed in the substrate according to embodiments of the present disclosure has a hexagonal shape and has an area of, for example, about 903 $\mu m^2$. The number of the notches 200 arranged in the same region 100 of the corner of the substrate is 164. Therefore, in the region 100 which has a same shape and a same area as the region 10, the number of the hexagonal notches 200 is increased by 11%, compared to the number of the quadrangular notches 10. Since the number of the notches is closely related to the specific surface area, the increase in the number of the notches may also lead to an improvement of the adhesive force between the substrate and the adhesive layer.

As shown in FIG. 2, FIG. 4-8, in some embodiments of the present disclosure, a substrate is provided. The substrate to be encapsulated comprises a base substrate 101, and a plurality of notches 200 arranged in an array located in a region to be attached to an encapsulation layer 50, wherein the plurality of notches 200 have a same shape of regular polygon. The regular polygon may be a regular hexagon or octagon. The base substrate may be an array substrate with a plurality of organic light emitting diodes. The array comprises a plurality of first rows 210 and a plurality of second rows 220 arranged alternately, and the plurality of notches 200 of in the plurality of first rows 210 and the plurality of second rows 220 have a displacement along a row direction. In some embodiments of the present disclosure, at least two adjacent notches in a same row have a gap 301 with a first length along the row direction. The gap 301 presents the nearest distance between two adjacent notches in a same row. The displacement has a second length along the row direction, and the first length is equal or smaller than the second length. The plurality of notches 200 are arranged along a same direction, one of diagonals of the regular polygon is parallel with or perpendicular to the row direction. In other words, the base substrate includes a first surface. The first surface includes a region 100 to be attached to an encapsulation layer. The region 100 defines a plurality of notches 200 arranged in an array. The array includes at least a first row and a second row adjacent to the first row. The first row 210 includes a plurality of first notches 200 and the second row 220 includes a plurality of second notches. The first plurality of notches 200 in the first row 210 are interlaced with the second plurality of notches 200 in the second row 220. An extending part is disposed on at least a portion of each of the notches 200, and a part of the region 100 is present between extending parts of two adjacent notches 200 in a same row. In other words, at least two adjacent notches in a same row are separated by a part of the region. The notches 200 in each row include a first notch 200a, and an extending part of each of the first notches 200a in the first row is facing to a part of the region 100 between extending parts of two adjacent notches 200 in the second row which are adjacent to the first notch 200a.

With the substrate according to embodiments of the present disclosure, the extending part may be formed at any notch 200 and there is a recessed part of the region of the first surface between extending parts of two adjacent notches 200 in the same row. In such a manner, the extending parts of at least some of the notches 200 (i.e., a plurality of the first notches 200a) in the first row are facing to the recessed parts described above. In such a case, compared to quadrangular notches 20 commonly used, at least some of the notches 200 in the first row may be interlaced with the notches in the second row and thus the number of notches 200 arranged in a same area can be increased. Therefore, the contact surface area between the substrate and an adhesive layer in the encapsulation process may be improved, as well as the encapsulation performances.

It should be noted that, as shown in FIG. 2, the notches 200 in a row (e.g., the first row 210) are interlaced with the notches 200 in another row (e.g., the second row 220) adjacent to the row. Here, the first notch 200a may be any non-peripheral notch in any row, i.e. the first notch 200a is not peripheral notches in any row, and the first notch 200a in a row is facing directly to the part of the region 100 between the extending parts of two adjacent notches in another row adjacent to the row. Specifically, the extending part of each of the first notches 200a in the first row is facing to the part of the region 100 between extending parts of two adjacent notches in the second row which are adjacent to the first notch 200a.

Figure 4:
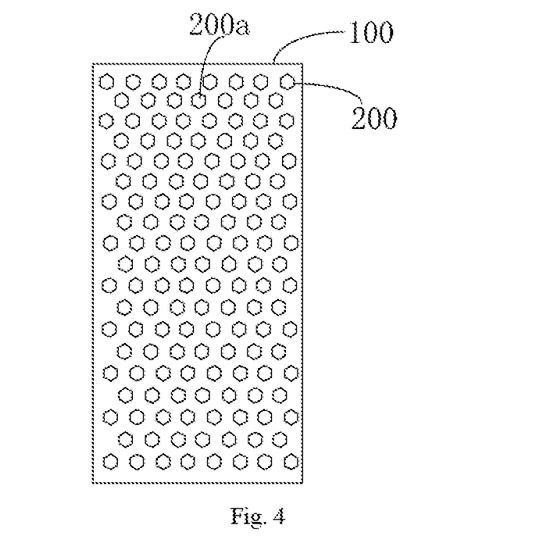
FIG. 4 is a schematic view illustrating a distribution of notches arranged in a region with a predetermined area of a substrate to be attached to an encapsulation layer according to some embodiments of the present disclosure.
Figure 5:
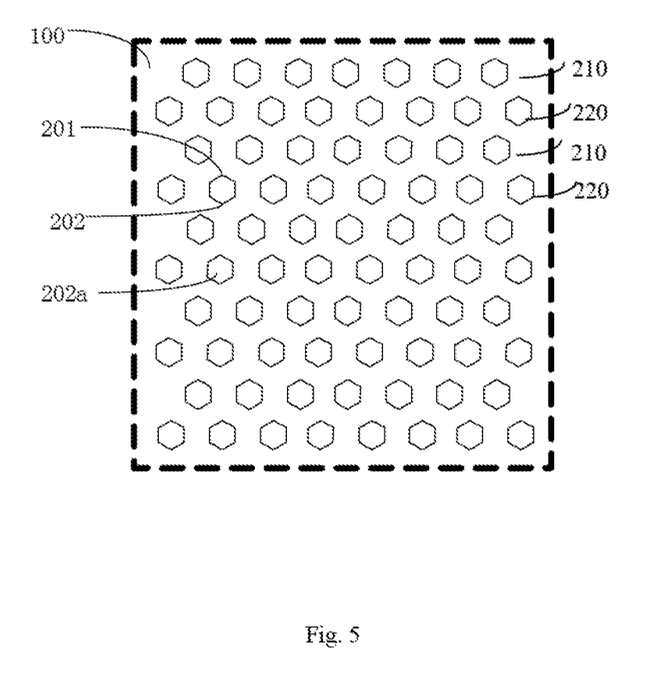
FIG. 5 is a schematic partial view of a region of a substrate to be attached to an encapsulation layer according to some embodiments of the present disclosure.

In some embodiments of the present disclosure, as shown in FIG. 2, FIG. 4 and FIG. 5, preferably, the notches 200 have a same shape. It should be appreciated that in actual applications, other examples where the notches 200 do not have a same shape may also be in the scope of this disclosure.

In some embodiments of the present disclosure, preferably, at least part of the extending part of the first notch 200a in the first row extends to the part of the region 100 between the extending parts of the two adjacent notches 200 in the second row which are adjacent to the first notch 200a.

In the embodiments described above, projections of the notches 200 in the two adjacent rows on a plane perpendicular to a row arrangement direction may be at least partially overlapped. In such a case, compared to quadrangular notches 20 commonly used, the number of notches 200 according to embodiments of the present disclosure arranged in the same region 100 is increased. Therefore, the contact surface area between the substrate and an adhesive layer in the encapsulation process may be improved, as well as the encapsulation performances.

In some embodiments of the present disclosure, as shown in FIG. 5, each of the notches 200 defines a first portion provided with a first extending part 201 and a second portion provided with a second extending part 202. Here, the first portions of the notches 200 are arranged in a same direction, and a part of the region 100 is present between the first extending parts 201 of two adjacent notches 200 in the same row. The second extending part 202 of the first notch 200a in the first row is facing to a part of the region 100 between the first extending parts of two adjacent notches 200 in the second row which are adjacent to the first notch 200a.

In one or more embodiments, extending parts are formed at portions of the notch 200 opposite to each other, such that a recessed part of the region 100 may be formed by the first extending parts at the first portions of any two adjacent notches 200. When the notch 200 is the first notch 200a, at least part of the second extending part 202 of the first notch 200a in the first row may extend to the part of the region 100 between the second extending parts 202 of the two adjacent notches 200 in the second row which are adjacent to the first notch 200a.

It should be understood that in other embodiments of the present disclosure, the structure of the notches 200 may have various modifications which are also in the scope of this disclosure. Other embodiments of structures of the notches 200 are described as follows.

The extending part is only provided at the first portion of the notch 200, and the notches 200 in the first row are interlaced with the notches in the second row and arranged in a different direction from the notches 200 in the second row. That is, the first portions of the notches 200 in the first row are arranged in a first direction and the first portions of the notches 200 in the second row are arranged in a second direction opposite to the first direction. In such a case, a recessed part of the region may be present between the extending parts of two adjacent notches 200 in the first row and the extending part of the first portion of the notch 200 in the second row may extend to the part of the region 100 between the extending parts of the two adjacent notches in the first row.

In addition, in some embodiments of the present disclosure, as shown in FIG. 5, a projection of each of the first extending part 201 and the second extending part 202 on the first surface includes an angle formed by two lines starting from a point. It should be understood that the shape of the projection of the extending part can be various according to actual applications, which is also in the scope of this disclosure.

Figure 7:
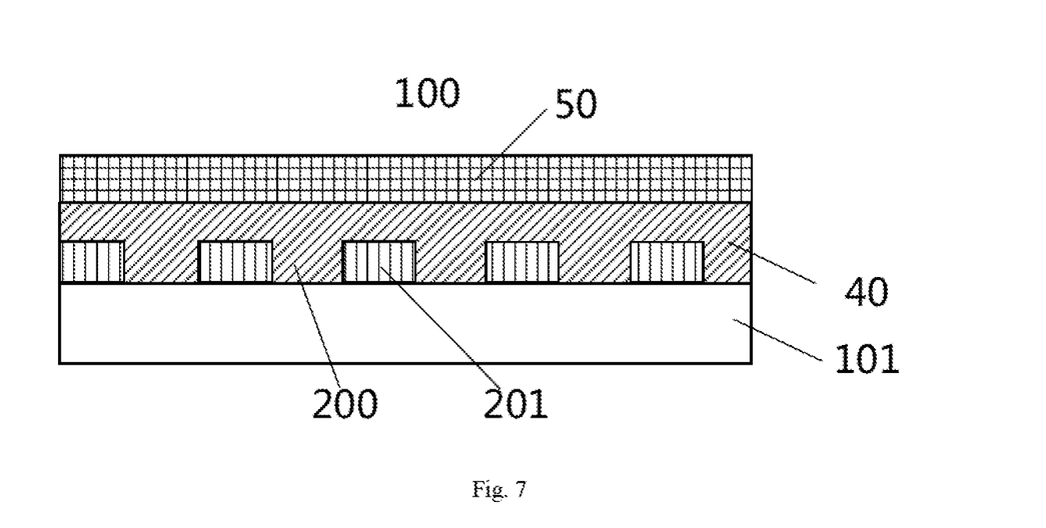
FIG. 7 is a schematic view according to some embodiments of the present disclosure with a structural layer.

In some embodiments of the present disclosure, as shown in FIG. 7, the substrate further comprises a structural layer 201 on the base substrate, and the plurality of notches are located in the structural layer. The structural layer comprises at least one of organic material, inorganic material or metal. It should be noted that the person skilled in the art could easily understand that a pattern process may be applied to form the notches in a structural layer having a film.

Figure 8:
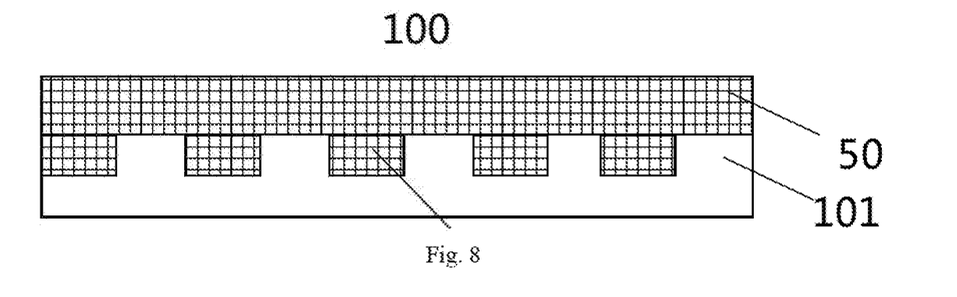
FIG. 8 is a schematic view according to some embodiments of the present disclosure with the notches located in the base substrate.

In some embodiments of the present disclosure, as shown in FIG. 8, the plurality of notches 200 are located in the base substrate 101. The base substrate 101 may be etched thereby forming the plurality of notches 200.

A specific embodiment of the present disclosure is provided as follows.

In some embodiments of the present disclosure, as shown in FIG. 5, a plurality of notches 200 are arranged into an array in a region to be attached to an encapsulation layer, and the array includes at least a first row and a second row adjacent to the first row. The notches in the first row are interlaced with the notches in the second row. A shape of a projection of the notch 200 on the first surface is a hexagon including a first angle and a second angle arranged diagonally. Specifically, the first extending part 201 corresponds to the first angle and the second extending part 202 corresponds to the second angle. More preferably, the shape of the projection of the notch 200 on the first surface is a regular hexagon and the first angle and the second angle are obtuse angles. Alternatively or additionally, each of the notches may define a hexagon hole.

It should be understood that, the structure of the notch may be various in other embodiments. Accordingly, the shape of the extending part may also be various, an example is described below.

Figure 6:
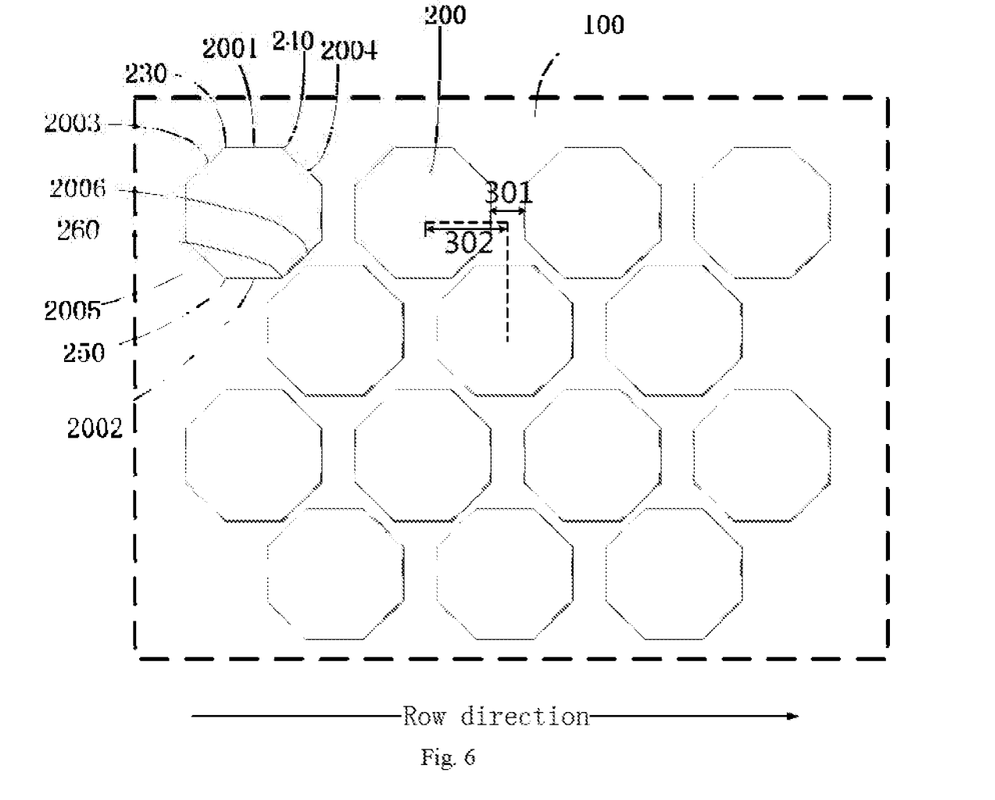
FIG. 6 is a schematic partial view of a region of a substrate to be attached to an encapsulation layer according to other embodiments of the present disclosure.

As shown in FIG. 6, the array comprises a plurality of first rows 210 and a plurality of second rows 220 arranged alternately, and the plurality of notches 200 of in the plurality of first rows A and the plurality of second rows B have a displacement 302 along a row direction. At least two adjacent notches 200 in a same row have a gap 301 with a first length along the row direction. The displacement 302 has a second length along the row direction which is equal to the orthographic projection of the line between centroids of two adjacent regular polygon in two adjacent rows respectively. And the first length is equal or smaller than the second length.

Furthermore in detail the shape of the notch 200 is an octagon including eight sides and eight angles. The sides includes a first side 2001, a second side 2002 opposite to the first side 2001, a third side 2003 adjacent to the first side 2001, a fourth side 2004 adjacent to the first side 2001, a fifth side 2005 adjacent to the second side 2002 and a sixth side 2006 adjacent to the second side 2002. A third angle 230 is formed by the first side 2001 and the third side 2003 and a fourth angle 240 is formed by the first side 2001 and the fourth side 2004. A fifth angle 250 is formed by the second side 2002 and the fifth side 2005 and a sixth angle 260 is formed by the second side 2002 and the sixth side 2006. Specifically a first extending part 201 is formed by the first side 2001, the third angle 230, the fourth angle 240, the third side 2003 and the fourth side 2004 of the octagonal notch together, and a second extending part 202 is formed by the second side 2002, the fifth angle 250, the sixth angle 260, the fifth side 2005 and the sixth side 2006 of the octagonal notch together.

The present disclosure is described in more detail with reference to embodiments of the present disclosure, e.g., a specific embodiment of hexagonal notches described below.

Figure 3:
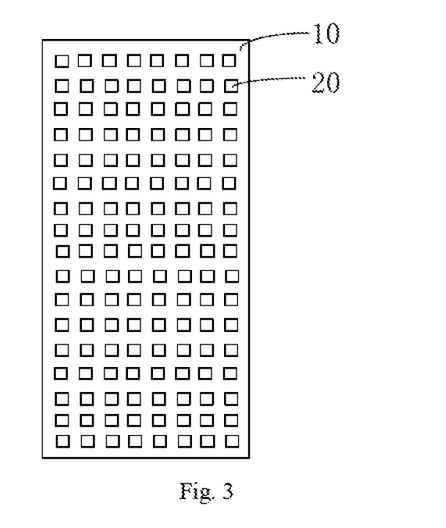
FIG. 3 is a schematic view illustrating a distribution of notches arranged in a region with a predetermined area of a substrate to be attached to an encapsulation layer in other implementations.

In addition, compared to the quadrangular notches arranged in a normal manner, a distribution density of the hexagonal notches arranged according to embodiments of the present disclosure is higher. FIG. 3 is a schematic view illustrating a distribution of notches arranged in a region with a predetermined area of a substrate to be attached to an encapsulation layer in other implementations. FIG. 4 is a schematic view illustrating a distribution of notches arranged in a region with a predetermined area of a substrate to be attached to an encapsulation layer according to some embodiments of the present disclosure. As shown in FIG. 3 and FIG. 4, the regions in FIG. 3 and FIG. 4 have the same area and the notches in FIG. 3 and FIG. 4 have the same area. For example, the hexagonal notch 200 has the same area as the quadrangular notch 20, and the number of the quadrangular notches is 136 and the number of the hexagonal notches 200 is 145. Therefore, the number of the hexagonal notches 200 is increased by 6%, compared to the number of the quadrangular notches 20. Since the number of the notches is closely related to the specific surface area, the increase in the number of the notches may also lead to an improvement of the adhesive force between the substrate and an adhesive layer.

Accordingly, if the hexagonal notches have a same area as the quadrangular notches, the number of the hexagonal notches is increased by 6% in a horizontal direction or a vertical direction, compared to the quadrangular notches. If the notches are arranged in the curved region of the corner of the substrate, the number of the hexagonal notches is increased by 11%, compared to the quadrangular notches.

It should be understood that the hexagonal notch 200 as described above is merely examples of notches formed in the substrate according to embodiments of the present disclosure. In other embodiments of the present disclosure, the notch may also have a pentagonal, triangular or irregular shape, which is also in the scope of the present disclosure. Specifically, if the notch has a pentagonal or triangular shape, the arrangement of the notches may be as follows. The notches in the first row are interlaced with the notches in the second row. The first portions of the notches in the first row are arranged in a first direction and the first portions of the notches in the second row are arranged in a second direction opposite to the first direction. In such a case, a recessed part of the region may be present between the extending parts of any two adjacent notches in the first row and the extending part of the first portion of the notch in the second row may extend to the recessed part of the region between the extending parts of the two adjacent notches in the first row.

In some embodiments of the present disclosure, an encapsulation assembly is provided. As shown in FIG. 7 and FIG. 8, the encapsulation assembly includes a base substrate 101, an encapsulation layer 50 that packages the base substrate 101 in a encapsulation region 100, an adhesive layer 40 between the base substrate and the encapsulation layer in the encapsulation region for attaching, and a plurality of notches arranged in an array are located in the encapsulation region, wherein the plurality of notches have a same shape of regular polygon. The base substrate may be an array substrate with a plurality of organic light emitting diodes.

In the disclosure, the encapsulation assembly may be an active matrix organic light emitting diode (AMOLED) display panel. It should be understood that in other embodiments, the encapsulation assembly may also be other types of the encapsulation assembly, which are in the scope of the present disclosure.

Moreover, in some embodiments of the present disclosure, a display device is provided, including an encapsulation assembly described above.

Although explanatory embodiments have been described above, it would be appreciated by those skilled in the art that changes, amendments, alternatives and modifications can be made without departing from principles and spirit of the present disclosure. The scope of the present disclosure is defined by the claims and the like.

What is claimed is:

1. A substrate to be encapsulated, comprising:
   a base substrate; and
   a plurality of notches in an encapsulation region to be attached to an encapsulation layer, wherein the plurality of notches have a same shape of regular polygon;
   wherein, in at least a sub-region of the encapsulation region, multiple notches of the plurality of notches are arranged in a first sub-array and a second sub-array, the first sub-array and the second sub-array interlaced with each other;
   the first sub-array comprises a plurality of first notches arranged in a plurality of first rows and a plurality of first columns;
   the second sub-array comprises a plurality of second notches arranged in a plurality of second rows and a plurality of second columns;
   the plurality of first columns and the plurality of second columns are alternately arranged along a row direction;
   the plurality of first rows and the plurality of second rows are alternately arranged along a column direction;
   centers of two directly adjacent notches respectively in two adjacent first columns of the plurality of first columns are spaced apart from each other by a first distance along the row direction;
   centers of two directly adjacent notches respectively in two adjacent second columns of the plurality of second columns are spaced apart from each other by a second distance along the row direction;

centers of two directly adjacent notches respectively in a respective first column of the plurality of first columns and a respective second column of the plurality of second columns are spaced apart by a third distance along the row direction, the respective first column and the respective second column directly adjacent to each other; and the third distance is less than the first distance and is less than the second distance;

wherein edges or tips of notches in the respective first column that are closest to the respective second column define a first imaginary line;

the first imaginary line crosses over notches in the respective second column;

edges or tips of notches in the respective second column that are closest to the respective first column define a second imaginary line; and the second imaginary line crosses over notches in the respective first column;

wherein edges or tips of notches in a respective first row of the plurality of first rows that are closest to a respective second row of the plurality of second rows define a third imaginary line;

the third imaginary line crosses over notches in the respective second row;

edges or tips of notches in the respective second row that are closest to the respective first row define a fourth imaginary line; and the fourth imaginary line crosses over notches in the respective first row;

wherein the sub-region is a corner region of the substrate, the corner region has a curved shape and is absent of any electrodes or signal lines.

2. The substrate according to claim 1, wherein centers of two directly adjacent notches respectively in two adjacent first rows of the plurality of first rows are spaced apart from each other by a fourth distance along the column direction;

centers of two directly adjacent notches respectively in two adjacent second rows of the plurality of second rows are spaced apart from each other by a fifth distance along the column direction;

centers of two directly adjacent notches respectively in a respective first row of the plurality of first rows and a respective second row of the plurality of second rows are spaced apart by a sixth distance along the column direction, the respective first row and the respective second row directly adjacent to each other; and the sixth distance is less than the third distance and is less than the fourth distance.

3. The substrate according to claim 2, wherein the plurality of notches are arranged along a same direction, one of diagonals of the regular polygon is parallel with the row direction.

4. The substrate according to claim 2, wherein the plurality of notches are arranged along a same direction, one of diagonals of the regular polygon is perpendicular to the row direction.

5. The substrate according to claim 1, further comprising a structural layer on the base substrate, wherein the plurality of notches are located in the structural layer.

6. The substrate according to claim 1, wherein the plurality of notches are located in the base substrate.

7. The substrate according to claim 1, wherein the regular polygon is a regular octagon or a regular hexagon.

8. An encapsulation assembly, comprising:

a base substrate;

an encapsulation layer that packages the base substrate in an encapsulation region;

an adhesive layer between the base substrate and the encapsulation layer in the encapsulation region for attaching; and a plurality of notches in the encapsulation region, wherein the plurality of notches have a same shape of regular polygon;

wherein, in at least a sub-region of the encapsulation region, multiple notches of the plurality of notches are arranged in a first sub-array and a second sub-array, the first sub-array and the second sub-array interlaced with each other;

the first sub-array comprises a plurality of first notches arranged in a plurality of first rows and a plurality of first columns;

the second sub-array comprises a plurality of second notches arranged in a plurality of second rows and a plurality of second columns;

the plurality of first columns and the plurality of second columns are alternately arranged along a row direction;

the plurality of first rows and the plurality of second rows are alternately arranged along a column direction;

centers of two directly adjacent notches respectively in two adjacent first columns of the plurality of first columns are spaced apart from each other by a first distance along the row direction;

centers of two directly adjacent notches respectively in two adjacent second columns of the plurality of second columns are spaced apart from each other by a second distance along the row direction;

centers of two directly adjacent notches respectively in a respective first column of the plurality of first columns and a respective second column of the plurality of second columns are spaced apart by a third distance along the row direction, the respective first column and the respective second column directly adjacent to each other; and the third distance is less than the first distance and is less than the second distance;

wherein edges or tips of notches in the respective first column that are closest to the respective second column define a first imaginary line;

the first imaginary line crosses over notches in the respective second column;

edges or tips of notches in the respective second column that are closest to the respective first column define a second imaginary line;

the second imaginary line crosses over notches in the respective first column;

wherein edges or tips of notches in a respective first row of the plurality of first rows that are closest to a respective second row of the plurality of second rows define a third imaginary line;

the third imaginary line crosses over notches in the respective second row;

edges or tips of notches in the respective second row that are closest to the respective first row define a fourth imaginary line; and the fourth imaginary line crosses over notches in the respective first row;

wherein the sub-region is a corner region of the encapsulation assembly, the corner region has a curved shape and is absent of any electrodes or signal lines.

9. The encapsulation assembly according to claim 8, wherein centers of two directly adjacent notches respectively in two adjacent first rows of the plurality of first rows are spaced apart from each other by a fourth distance along the column direction;
  centers of two directly adjacent notches respectively in two adjacent second rows of the plurality of second rows are spaced apart from each other by a fifth distance along the column direction;
  centers of two directly adjacent notches respectively in a respective first row of the plurality of first rows and a respective second row of the plurality of second rows are spaced apart by a sixth distance along the column direction, the respective first row and the respective second row directly adjacent to each other; and
  the sixth distance is less than the third distance and is less than the fourth distance.

10. The encapsulation assembly according to claim 9, wherein the plurality of notches are arranged along a same direction, one of diagonals of the regular polygon is parallel with the row direction.

11. The encapsulation assembly according to claim 9, wherein the plurality of notches are arranged along a same direction, one of diagonals of the regular polygon is perpendicular to the row direction.

12. The encapsulation assembly according to claim 8, further comprising a structural layer on the base substrate, wherein the plurality of notches are located in the structural layer.

13. The encapsulation assembly according to claim 8, wherein the plurality of notches are located in the base substrate.

14. The encapsulation assembly according to claim 8, wherein the regular polygon is a regular octagon or a regular hexagon.

15. The encapsulation assembly according to claim 8, wherein the encapsulation assembly is an active matrix organic light emitting diode (AMOLED) display panel.

16. A display device, comprising an encapsulation assembly according to claim 8.

* * * * *